(12) United States Patent
Hatano et al.

(10) Patent No.: US 6,252,265 B1
(45) Date of Patent: Jun. 26, 2001

(54) SINGLE-LAYER-ELECTRODE TYPE TWO-PHASE CHARGE COUPLED DEVICE HAVING SMOOTH CHARGE TRANSFER

(75) Inventors: Keisuke Hatano; Yasutaka Nakashiba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/396,014

(22) Filed: Sep. 15, 1999

Related U.S. Application Data

(62) Division of application No. 08/885,463, filed on Jun. 27, 1997, now Pat. No. 6,018,170.

(30) Foreign Application Priority Data

Jun. 28, 1996 (JP) .................................................. 8-188905

(51) Int. Cl.[7] ...................... H01L 27/148; H01L 29/768; H01L 29/788

(52) U.S. Cl. ..................... 257/250; 257/236; 257/249; 257/315; 257/316

(58) Field of Search ................................ 257/236, 249, 257/250, 315, 316

(56) References Cited

U.S. PATENT DOCUMENTS

| | | | |
|---|---|---|---|
| 5,270,559 | * 12/1993 | Yariv et al. | 257/249 |
| 5,345,099 | * 9/1994 | Yamada | 257/250 |
| 5,530,275 | * 6/1996 | Widdershoven | 257/319 |

* cited by examiner

*Primary Examiner*—Ngân V. Ngô
(74) *Attorney, Agent, or Firm*—Hayes, Soloway, Hennessey, Grossman & Hage, PC

(57) ABSTRACT

In a charge coupled device, trap levels formed by insulating layers or floating electrodes are formed on a semiconductor layer or a semiconductor substrate. Stationary charges are trapped in some of the trap levels or floating electrodes. The charge transfer electrodes are in self-alignment with potential barrier regions.

6 Claims, 11 Drawing Sheets

POTENTIAL

POTENTIAL

POTENTIAL

POTENTIAL

POTENTIAL

SINGLE-LAYER-ELECTRODE TYPE TWO-PHASE CHARGE COUPLED DEVICE HAVING SMOOTH CHARGE TRANSFER

This is a divisional of application Ser. No. 08/885,463 filed on Jun. 27, 1997, now U.S. Pat. No. 6,018,170 and which designated the U.S.

BACKGROUND OF THE INVENTION

1. Field of the Invention

The present invention relates to a single-layer-electrode type two-phase charge coupled device (CCD) and a method for manufacturing the same.

2. Description of the Related Art

Recently, single-layer-electrode type two-phase CCDs have been developed by etching a single conductive layer with a fine photolitohgraphy and etching process to obtain electrodes whose spacing is about 0.2 to 0.3 µm.

In the single-layer-electrode two-phase CCDs, since no overlapping of the electrodes is present, a capacitance between the electrodes can be small and no poor insulation is present between the electrodes. Further, since it is unnecessary to oxidize the electrodes to obtain insulation thereof, the electrodes can be made of metal or silicide in addition to polycrystalline silicon, to further reduce the resistance of the electrodes.

A prior art single-layer-electrode type two-phase CCD includes a semiconductor substrate having a plurality of semiconductor regions, and also, includes a plurality of charge transfer electrodes opposing the semiconductor regions. This will be explained later in detail.

In the above-mentioned prior art CCD, however, the semiconductor regions are not in self-alignment with the charge transfer electrodes. As a result, if the semiconductor regions are shifted in the outside or inside direction with respect to the charge transfer electrodes, potential protrusions or potential recesses appear in the potential within the CCD. The potential protrusions and potential recesses reduce the efficiency of charge transfer.

SUMMARY OF THE INVENTION

It is an object of the present invention to provide a single-layer-electrode type two-phase CCD capable of smooth charge transfer.

According to the present invention, in a charge coupled device, trap levels formed by insulating layers or floating electrodes are formed on a semiconductor layer (or a semiconductor substrate). Stationary charges are trapped in some of the trap levels or floating electrodes. The charge transfer electrodes are in self-alignment with potential barrier regions.

Thus, potential protrusions or potential recesses within the CCD are dissolved to enhance the charge transfer efficiency.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, a prior art single-layer-electrode type two-phase CCD will be explained with reference to FIGS. 1A, 1B, 2A, 2B, 2C, 3A, 3B, 4A and 4B.

Figure 1A:
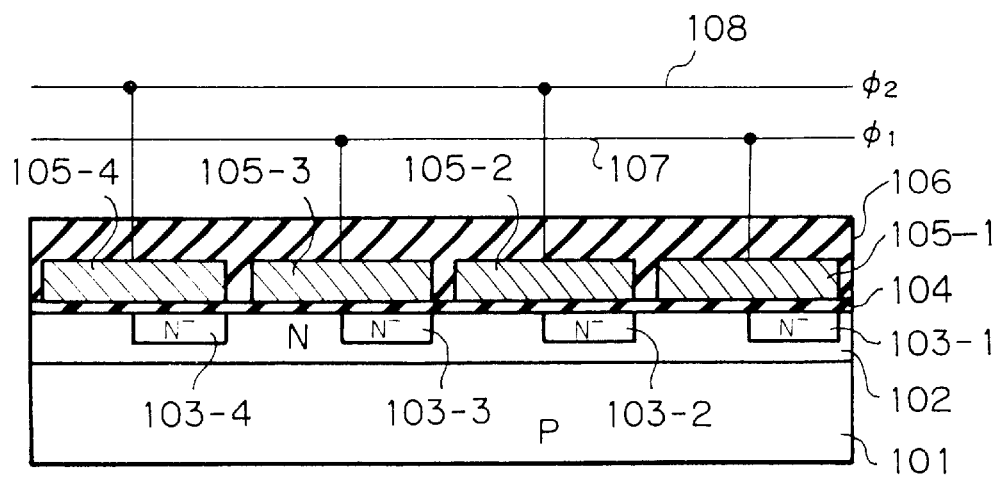
FIG. 1A is a cross-sectional view illustrating a prior art single-layer-electrode type two-phase CCD.
Figure 1B:
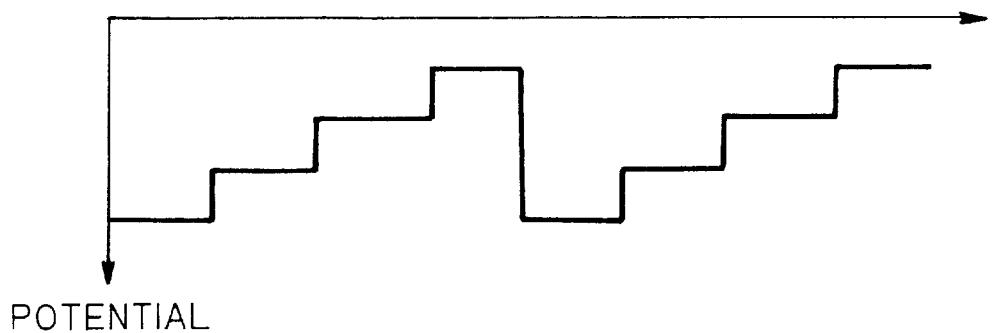
FIG. 1B is a potential diagram of the CCD of FIG. 1A.

FIG. 1A is a cross-sectional view illustrating a prior art single-layer-electrode type two-phase CCD, and FIG. 1B is a potential diagram of the CCD of FIG. 1A. Note that the CCD of FIG. 1A is of a buried channel type.

In FIG. 1A, reference numeral 101 designates a P-type semiconductor substrate in which an N-type semiconductor layer 102 is formed. Further, $N^-$-type semiconductor regions 103-1, 103-2, . . . serving as potential barrier regions are formed equidistantly within the N-type semiconductor region 102.

In addition, a gate insulating layer 104 is formed on the N-type semiconductor layer 102 and the $N^-$-type semiconductor regions 103-1, 103-2, . . . . Further, single-layered charge transfer electrodes 105-1, 105-2, . . . are arranged on the gate insulating layer 104, and the charge transfer electrodes 105-1, 105-2, . . . are covered by an insulating layer 106.

The change transfer electrodes 105-1, 105-3, . . . are connected to a metal wiring layer 107, and the charge transfer electrodes 105-2, 105-4, . . . are connected to a metal wiring layer 108. When clock signals $\phi_1$ and $\phi_2$ opposite in phase to each other are applied to the metal wiring layers 107 and 108, respectively, the potential within the device is shown in FIG. 1B, thus transferring charges therethrough.

The manufacturing steps of the CCD of FIG. 1A are explained next with reference to FIGS. 2A, 2B and 2C.

Figure 2A:
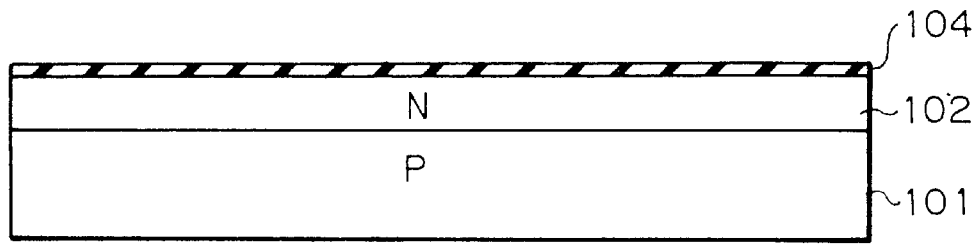
FIGS. 2A, 2B and 2C are cross-sectional views for explaining the method for manufacturing the CCD of FIG. 1A.

First, referring to FIG. 2A, an N-type semiconductor layer 102 is formed in a P-type semiconductor substrate 101 made of monocrystalline silicon. Then, the semiconductor substrate 101 (the N-type semiconductor layer 102) is thermally oxidized to form a gate insulating layer 104 made of silicon oxide.

Figure 2B:
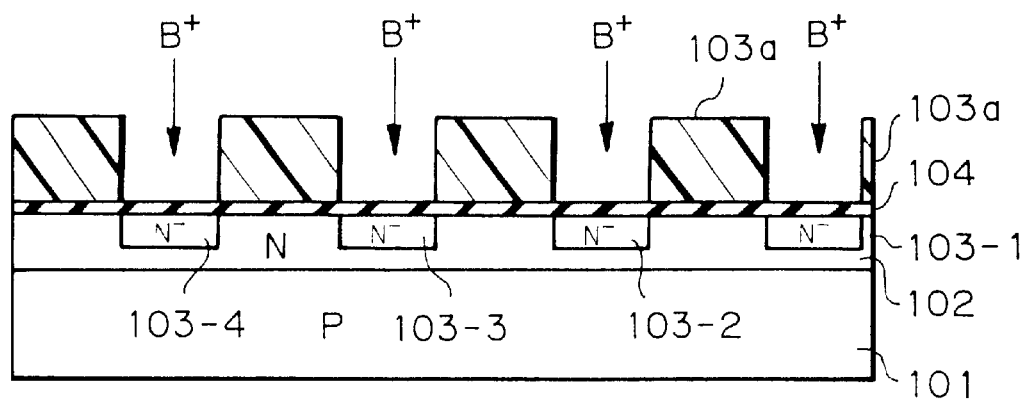

Next, referring to FIG. 2B, a photoresist pattern 103a is formed by a photolithography process. Then, boron ions are implanted into the N-type semiconductor layer 102 by using the photoresist pattern 103a as a mask to form N⁻-type semiconductor regions 103-1, 103-2, . . . serving as potential barriers are formed within the N-type semiconductor layer 102. Then, the photoresist pattern 103a is removed.

Figure 2C:
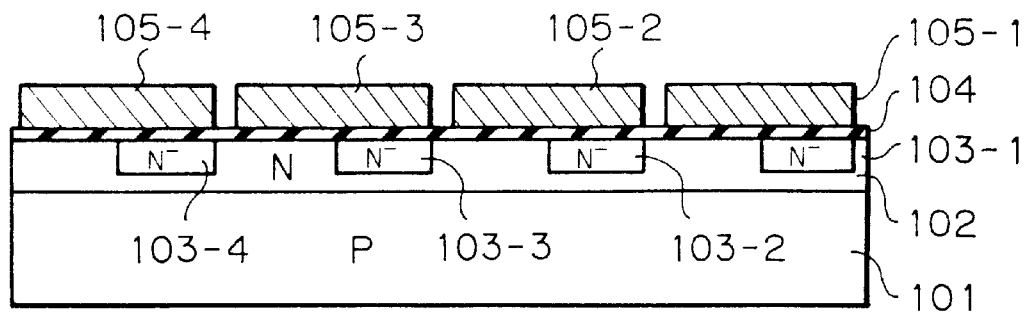

Finally, referring to FIG. 2C, charge transfer electrodes 105-1, 105-2, . . . are formed on the gate insulating layer 104. Then, an insulating layer 106 and metal wiring layers 107 and 108 (see FIG. 1) are formed to complete the CCD of FIG. 1A.

Figure 3A:
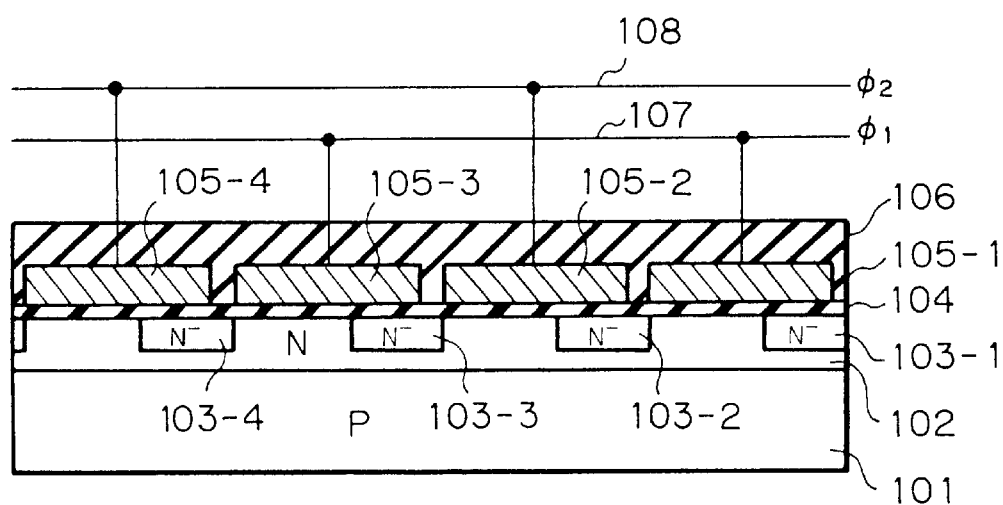
FIGS. 3A and 3B are cross-sectional views for explaining the problem in the CCD of FIG. 1A.
Figure 3B:
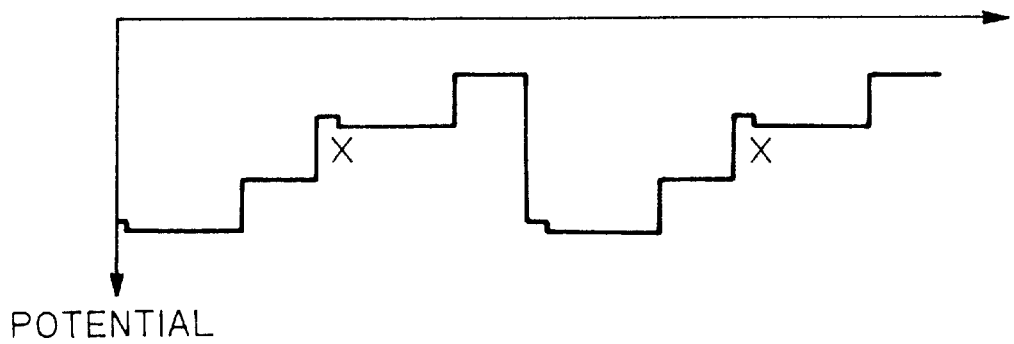
Figure 4A:
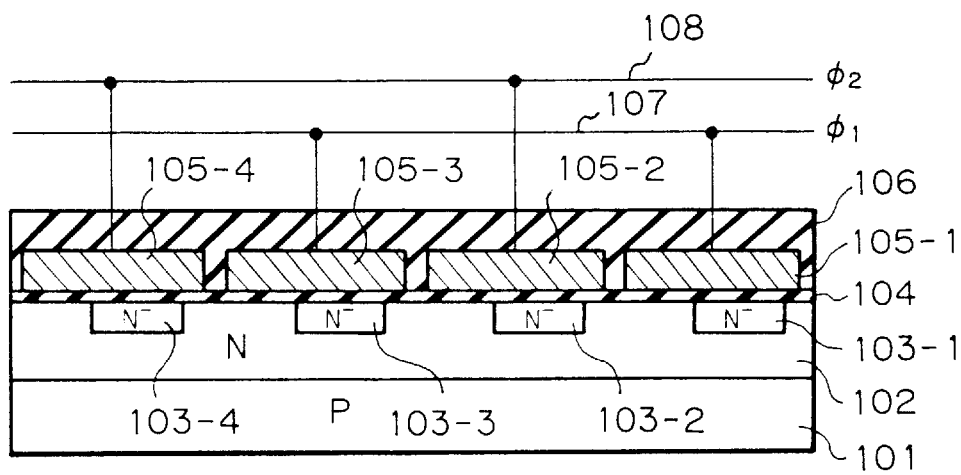
FIGS. 4A and 4B are cross-sectional views for explaining the problem in the CCD of FIG. 1A.
Figure 4B:
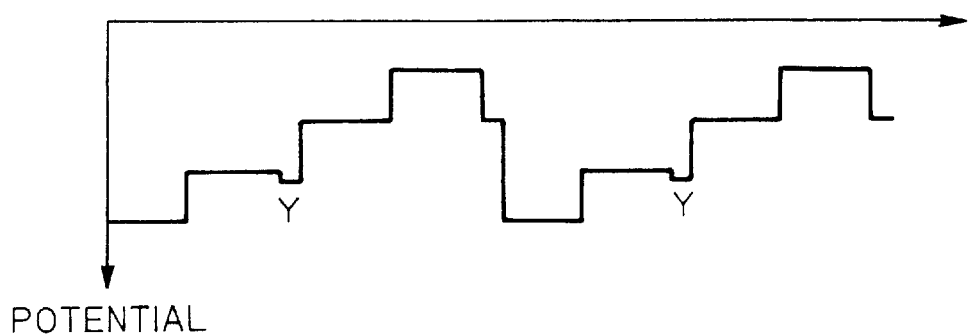

In the prior art CCD as illustrated in FIGS. 1A, 2A, 2B and 2C, however, the N⁻-type semiconductor regions 103-1, 103-2, . . . are not in self-alignment with the charge transfer electrodes 105-1, 105-2, . . . . As a result, if the N⁻-type semiconductor regions 103-1, 103-2, . . . are shifted in the outside direction with respect to the charge transfer electrodes 105-1, 105-2, . . . , as illustrated in FIG. 3A, potential protrusions appear in the potential as indicated by X in FIG. 3B. On the other hand, if the N⁻-type semiconductor regions 103-1, 103-2, . . . are shifted in the inside direction with respect to the charge transfer electrodes 105-1, 105-2, . . . , as illustrated in FIG. 4A, potential recesses appear in the potential as indicated by Y in FIG. 4B. The potential protrusions and potential recesses reduce the efficiency of charge transfer.

Figure 5A:
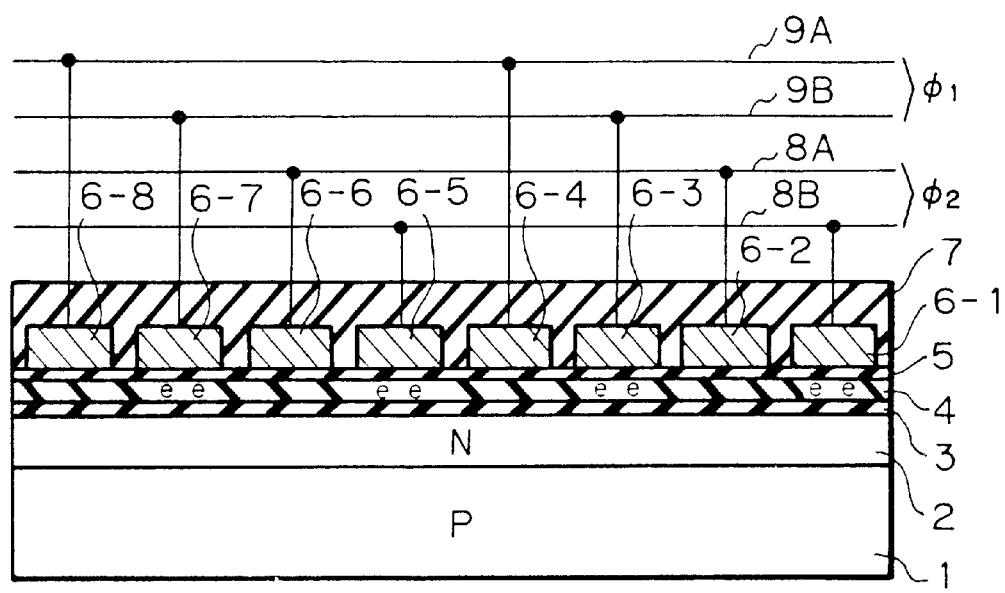
FIG. 5A is a cross-sectional view illustrating a first embodiment of the single-layer-electrode type two-phase CCD according to the present invention.
Figure 5B:
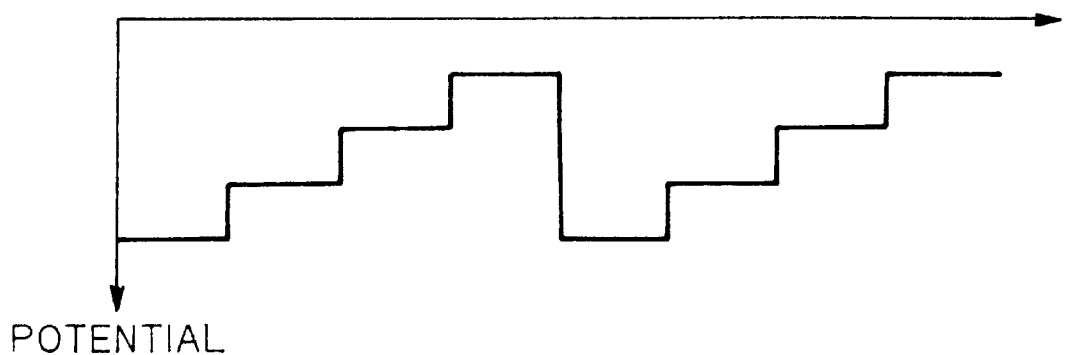
FIG. 5B is a potential diagram of the CCD of FIG. 5A.

FIG. 5A is a cross-sectional view illustrating a first embodiment of the single-layer-electrode type two-phase CCD according to the present invention, and FIG. 5B is a potential diagram of the CCD of FIG. 5A.

In FIG. 5A, reference numeral 1 designates a P-type semiconductor substrate in which an N-type semiconductor layer 2 is formed. Further, a triple-layer structure i.e., a silicon oxide layer 3, a silicon nitride layer 4 and a silicon oxide layer 5 are formed on the N-type semiconductor layer 2.

Further, single-layered charge transfer electrodes 6-1, 6-2, . . . are arranged on the silicon oxide layer 5, and the charge transfer electrodes 6-1, 6-2, . . . are covered by an insulating layer 7.

The charge transfer electrodes 6-1, 6-2, 6-5, 6-6 . . . are connected to metal wiring layers 8A and 8B, and the charge transfer electrodes 6-3, 6-4, 6-7, 6-8, . . . are connected to metal wiring layers 9A and 9B. Also, electrons are injected into an interface between the silicon oxide layer 3 and the silicon nitride layer 4 or an interface between the silicon nitride layer 4 and the silicon oxide layer 5 under the charge transfer electrodes 6-1, 6-3, . . . . That is, the electron-injected portions correspond to the N⁻-type semiconductor regions 103-1, 103-2, . . . of FIG. 1, and the electron-injected portions serving as potential barrier regions are in self-alignment with the charge transfer electrodes 6-1, 6-3, . . . . Therefore, when clock signals $\phi_1$ and $\phi_2$ opposite in phase to each other are applied to the metal wiring layers 8A(8B) and 9A(9B), respectively, the potential within the device is shown in FIG. 5B. In this case, since no potential protrusion or recess appears in the potential, charges are smoothly transferred through the device.

The manufacturing steps of the CCD of FIG. 5A are explained next with reference to FIGS. 6A, 6B and 6C.

Figure 6A:
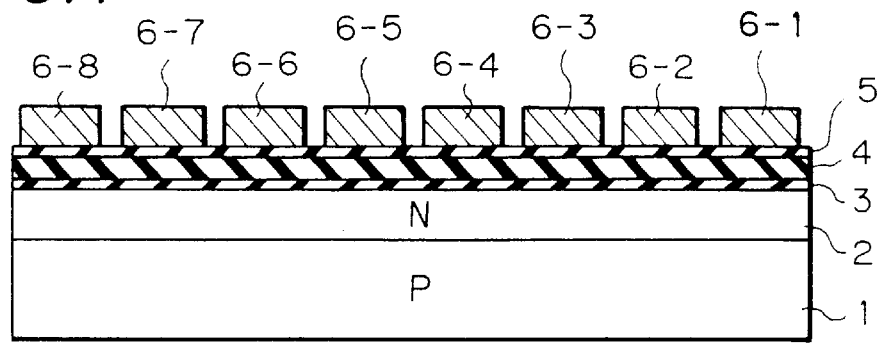
FIGS. 6A, 6B and 6C are cross-sectional views for explaining the method for manufacturing the CCD of FIG. 5A.

First, referring to FIG. 6A, an about 0.5 μm thick N-type semiconductor layer 2 is formed in a P-type semiconductor substrate 1 formed by monocrystalline silicon having an impurity concentration of about $1 \times 10^{15}$ cm⁻³.

Then, the semiconductor substrate 1 (the N-type semiconductor layer 2) is thermally oxidized to form an about 200 Å thick silicon oxide layer 3. Then, an about 200 Å thick silicon nitride layer 4 is formed by a CVD process, and thereafter, an about 500 Å thick silicon oxide layer 5 is formed by a CVD process. Thus, a triple-structured insulating layer is completed.

Then, an about 0.2 μm thick polycrystalline silicon layer is deposited by a CVD process, and the polycrystalline silicon layer is patterned by a photolithography and etching process to form charge transfer electrodes 6-1, 6-2, . . . whose spacing is about 0.2 to 0.3 μm.

Figure 6B:
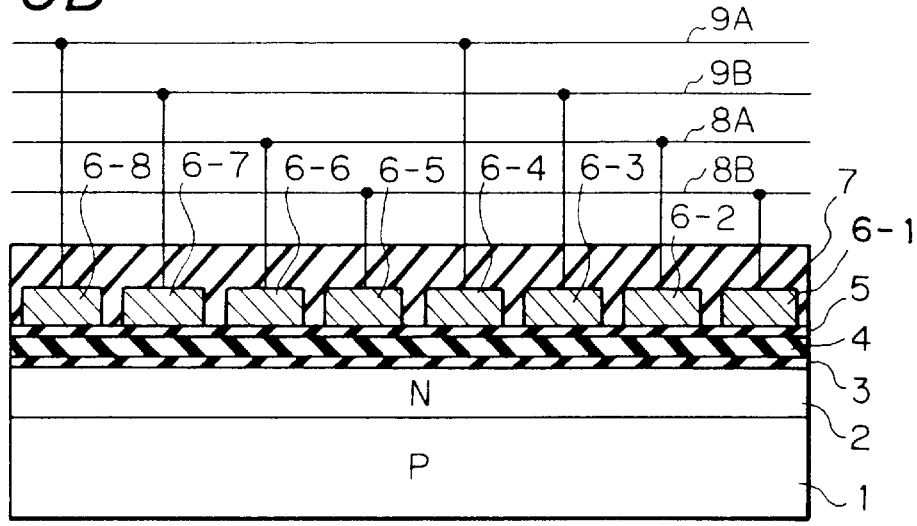

Next, referring to FIG. 6B, an insulating layer 7 and metal wiring layers 8A, 8B, 9A and 9B are formed. In this case, the metal wiring layer 8A is connected to the charge transfer electrodes 6-2, 6-6, . . . , the metal wiring layer 8B is connected to the charge transfer electrodes 6-1, 6-5, . . . , the metal wiring layer 9A is connected to the charge transfer electrodes 6-4, 6-8, . . . , and the metal wiring layer 9B is connected to the charge transfer electrodes 6-3, 6-7, . . . .

Figure 6C:
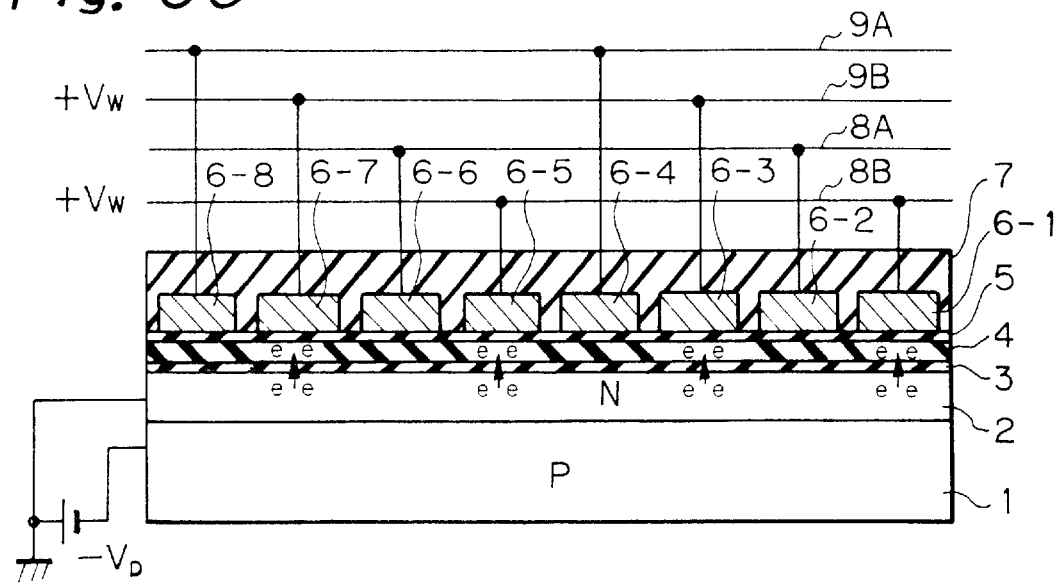

Finally, referring to FIG. 6C, a reverse bias voltage $V_D$ is applied between the semiconductor substrate 1 and the N-type semiconductor layer 2, so that the N-type semiconductor layer 2 becomes in an electron accumulation state. In this state, a positive pulse voltage $+V_W$ such as +40V is applied to the metal wiring layers 8B and 9B. As a result, electrons are injected from the N-type semiconductor layer 2 through the silicon oxide layer 3 to an interface between the silicon nitride layer 4 and the silicon oxide layer 3 under the charge transfer electrodes 6-1, 6-3, . . . by the tunneling effect. Therefore, electrons are trapped in the trap level at the above-mentioned interface.

Note that the amount of electrons trapped in the trap level can be controlled by the value and duration of the positive pulse voltage $+V_W$, and therefore, the potential characteristics can be arbitrarily shifted.

Thus, the CCD of FIG. 5A is completed.

Figure 7:
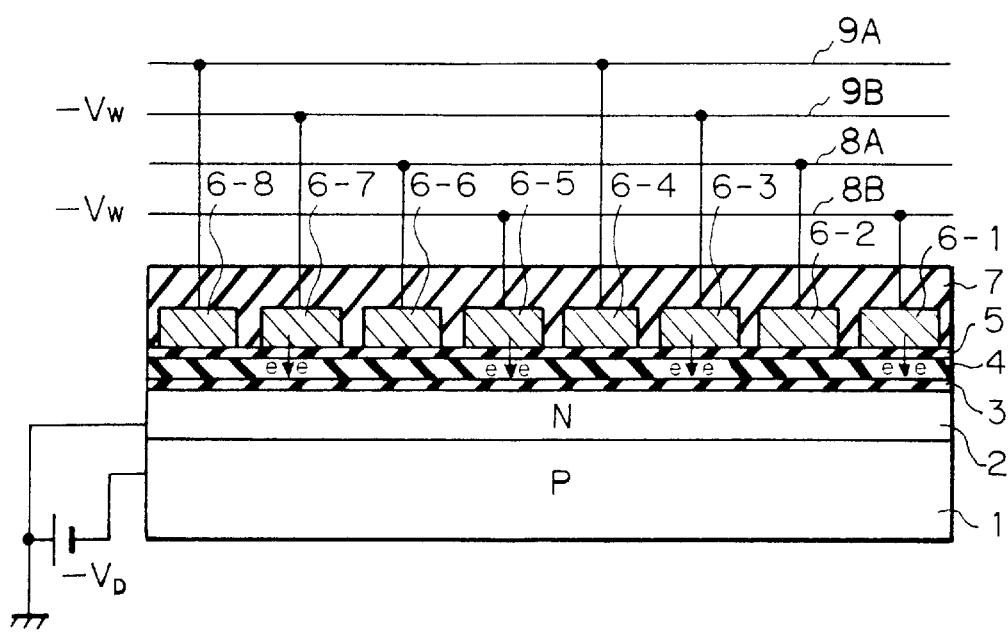
FIG. 7 is a cross-sectional view illustrating a modification of the CCD of FIG. 6C.

In FIG. 7, which illustrates a modification of FIG. 6C, a reverse bias voltage $V_B$ is also applied between the semiconductor substrate 1 and the N-type semiconductor layer 2, so that the N-type semiconductor layer 2 becomes in an electron accumulation state. In this state, a negative pulse voltage $-V_W$ such as −40V is applied to the metal wiring layers 8B and 9B. As a result, electrons are injected from the charge transfer electrodes 6-1, 6-3, . . . through the silicon oxide layer 5 to an interface between the silicon nitride layer 4 and the silicon oxide layer 5 under the charge transfer electrodes 6-1, 6-3, . . . by the tunneling effect. Therefore, electrons are trapped in the trap level at the above-mentioned interface.

Note that the amount of electrons trapped in the trap level can be controlled by the value and duration of the negative pulse voltagte $-V_W$, and therefore, the potential characteristics can be arbitrarily shifted.

Thus, the CCD of FIG. 5A is also completed.

Figure 8A:
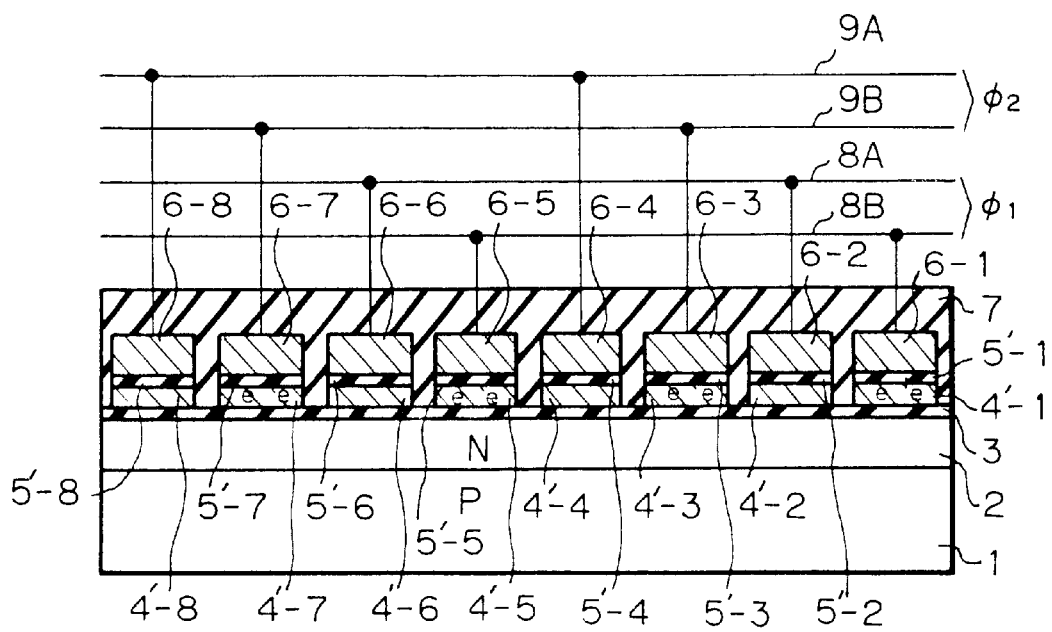
FIG. 8A is a cross-sectional view illustrating a second embodiment of the single-layer-electrode type two-phase CCD according to the present invention.
Figure 8B:
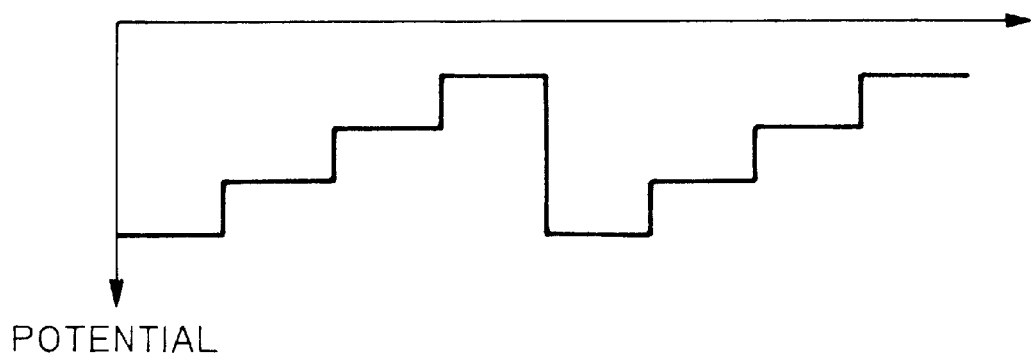
FIG. 8B is a potential diagram of the CCD of FIG. 8A.

FIG. 8A is a cross-sectional view illustrating a second embodiment of the single-layer-electrode type two-phase CCD according to the present invention, and FIG. 8B is a potential diagram of the CCD of FIG. 8A.

In FIG. 8A, the silicon nitride layer 4 of FIG. 5A is replaced by floating electrodes 4'-1, 4'-2, . . . , and the silicon oxide layer 5 of FIG. 5A is replaced by silicon oxide layers 5'-1, 5'-2, . . . .

Also, electrodes are injected into the floating electrodes 4'-1, 4'-3, . . . . That is, the electron-injected floating electrodes 4'-1, 4'-3, . . . correspond to the N⁻-type semiconductor regions 103-1, 103-2, . . . of FIG. 1, and the electron-injected floating electrodes 4'-1, 4'-3 serving as potential barrier regions are in self-alignment with the charge transfer electrodes 6-1, 6-3, . . . . Therefore, when clock signals $\phi_1$ and $\phi_2$ opposite in phase to each other are applied to the metal wiring layers 8A(8B) and 9A(9B), respectively, the potential within the device is shown in FIG. 8B. In this case, since no potential protrusion or recess appears in the potential, charges are smoothly transferred through the device.

The manufacturing steps of the CCD of FIG. 8A are explained next with reference to FIGS. 9A, 9B, and 9C.

Figure 9A:
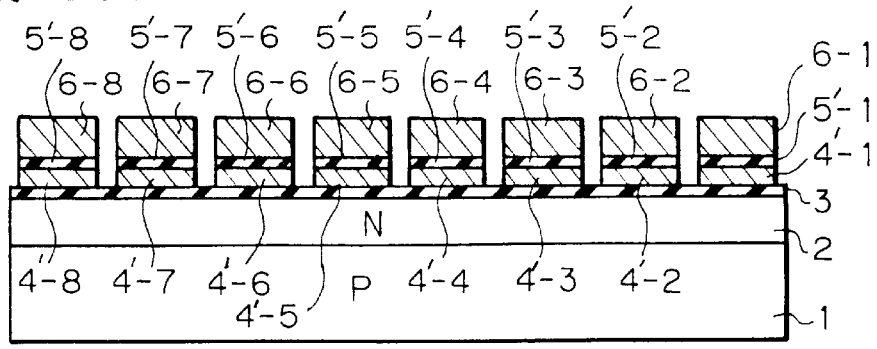
FIGS. 9A, 9B and 9C are cross-sectional views for explaining the method for manufacturing the CCD of FIG. 8A.

First, referring to FIG. 9A, an about 0.5 $\mu$m thick N-type semiconductor layer 2 is formed in a P-type semiconductor substrate 1 formed by monocrystalline silicon having an impurity concentration of about $1 \times 10^{15}$ cm$^{-3}$.

Then, the semiconductor substrate 1 (the N-type semiconductor layer 2) is thermally oxidized to form an about 200 Å thick silicon oxide layer 3. Then, an about 0.15 $\mu$m thick polycrystalline silicon layer is formed by a CVD process, and thereafter, an about 500 Å thick silicon oxide layer is formed by a CVD process. Then, an about 0.2$\mu$m thick polycrystalline silicon layer is deposited by a CVD process.

Then, the polycrystalline silicon layer, the silicon oxide layer and the polycrystalline silicon layer are patterned by a photolithography and etching process to form charge transfer electrodes 6-1, 6-2, . . . , silicon oxide layers 5'-1, 5'-2, . . . , and floating electrodes 4'-1, 4'-2, . . . whose interval is about 0.2 to 0.3 $\mu$m.

Figure 9B:
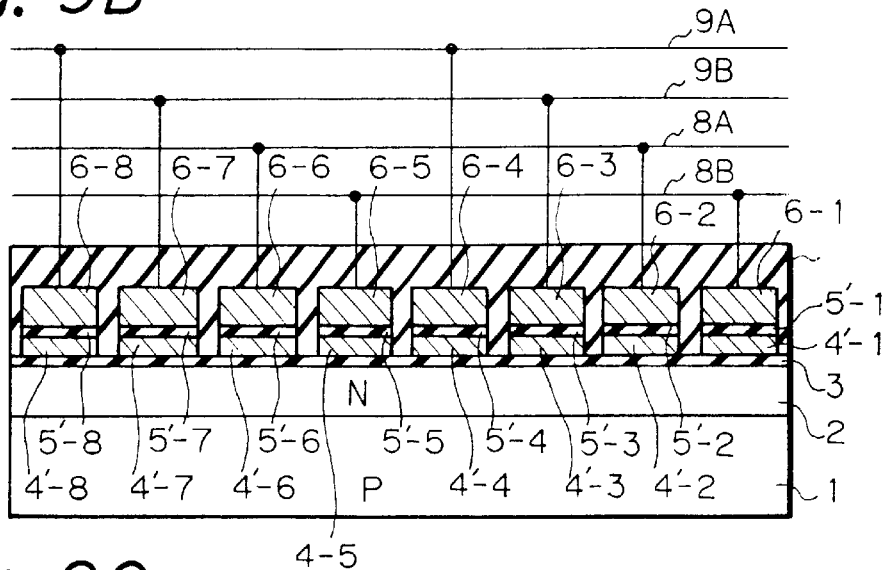

Next, referring to FIG. 9B, in the same way as in FIG. 6B, an insulating layer 7 and metal wiring layers 8A, 8B, 9A and 9B are formed. In this case, the metal wiring layer 8A is connected to the charge transfer electrodes 6-2, 6-6, . . . , the metal wiring layer 8B is connected to the charge transfer electrodes 6-1, 6-5, . . . , the metal wiring layer 9A is connected to the charge transfer electrodes 6-4, 6-8, . . . , and the metal wiring layer 9B is connected to the charge transfer electrodes 6-3, 6-7, . . . .

Figure 9C:
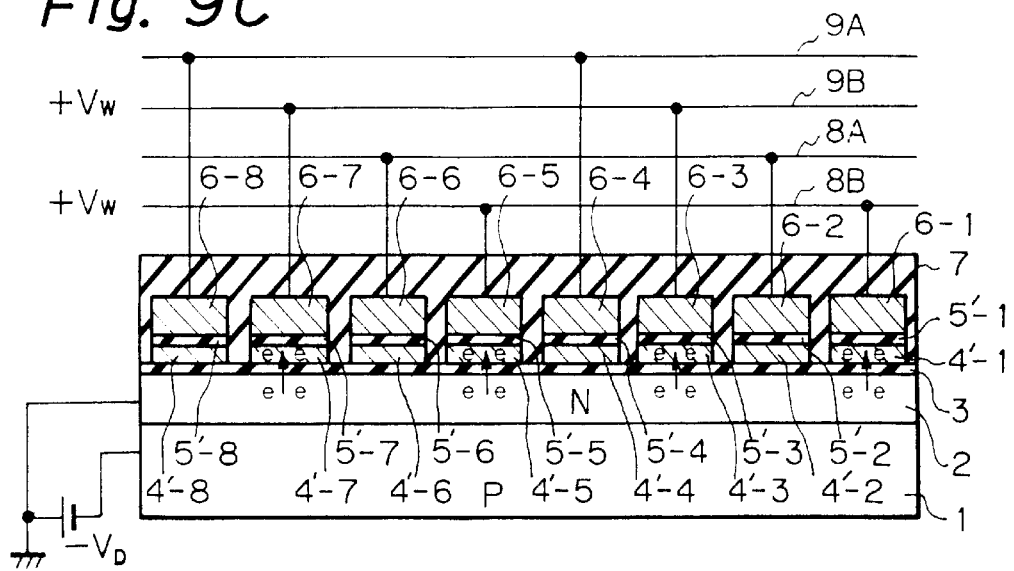

Finally, referring to FIG. 9C, in a similar way to that in FIG. 6C, a reverse bias voltage $V_D$ is applied between the semiconductor substrate 1 and the N-type semiconductor layer 2, so that the N-type semiconductor layer 2 becomes in an electron accumulation state. In this state, a positive pulse voltage +$V_W$ such as +40V is applied to the metal wiring layers 8B and 9B. As a result, electrons are injected from the N-type semiconductor layer 2 through the silicon oxide layer 3 to floating electrodes 4'-1, 4'-3, . . . by the tunneling effect. Therefore, electrons are trapped in the floating electrodes 4'-1, 4'-3, . . . .

Note that the amount of electrons trapped in the floating electrodes 4'-1, 4'-3, . . . can be controlled by the value and duration of the positive pulse voltage +$V_W$, and therefore, the potential characteristics can be arbitrarily shifted.

Thus, the CCD of FIG. 8A is completed.

Figure 10:
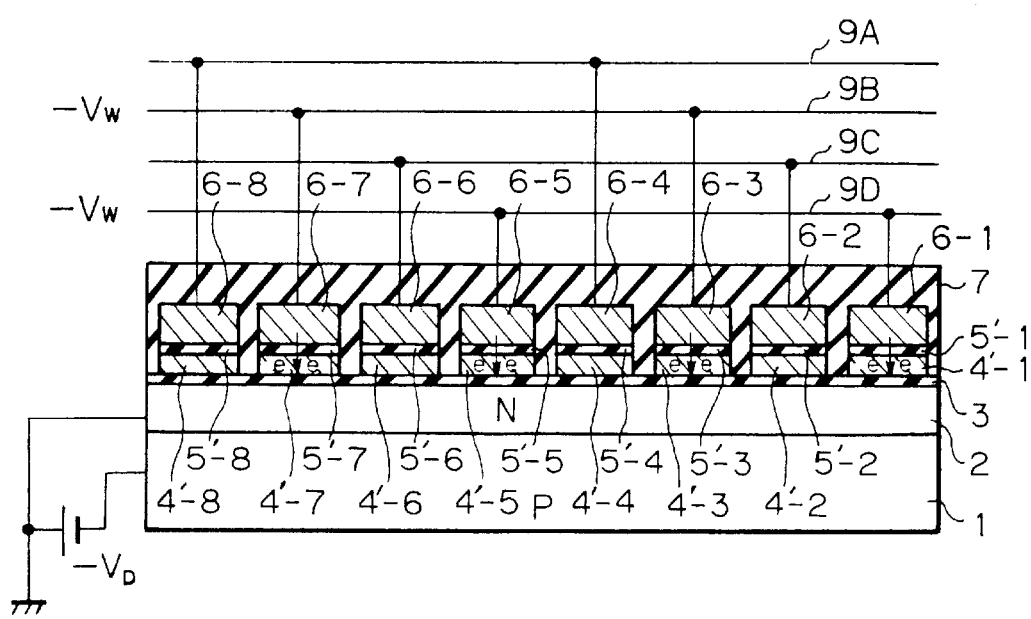
FIG. 10 is a cross-sectional view illustrating a modification of the CCD of FIG. 9C.

In FIG. 10, illustrates a modification of FIG. 9C, a reverse bias voltage $V_D$ is also applied between the semiconductor substrate 1 and the N-type semiconductor layer 2, so that the N-type semiconductor layer 2 becomes in an electron accumulation state. In this state, a negative pulse voltage -$V_W$ such as -40V is applied to the metal wiring layers 8B and 9B. As a result, electrons are injected from the charge transfer electrodes 6-1, 6-3, . . . through the silicon oxide layer 5'-1, 5'-3, . . . to the floating electrodes 4'-1, 4'-3, . . . by the tunneling effect. Therefore, electrons are trapped in the floating electrodes 4'-1, 4'-3, . . . .

Note that the amount of electrons trapped in the floating electrodes 4'-1, 4'-3, . . . can be controlled by the value and duration of the negative pulse voltagte -$V_W$, and therefore, the potential characteristics can be arbitrarily shifted.

Thus, the CCD of FIG. 8A is also completed.

In the second embodiment, since electrons are injected into the floating electrodes, the amount of injected electrons is homogeneous in the floating electrodes, and the amount of injected electrons in the floating electrodes can be increased to increase the shift amount of the potential characteristics, as compared with the first embodiment.

Also, the present invention can be applied to a buried channel type P-channel CCD where the semiconductor substrate 1 is of an N-type and the semiconductor layer 2 is of a P-type.

Figure 11A:
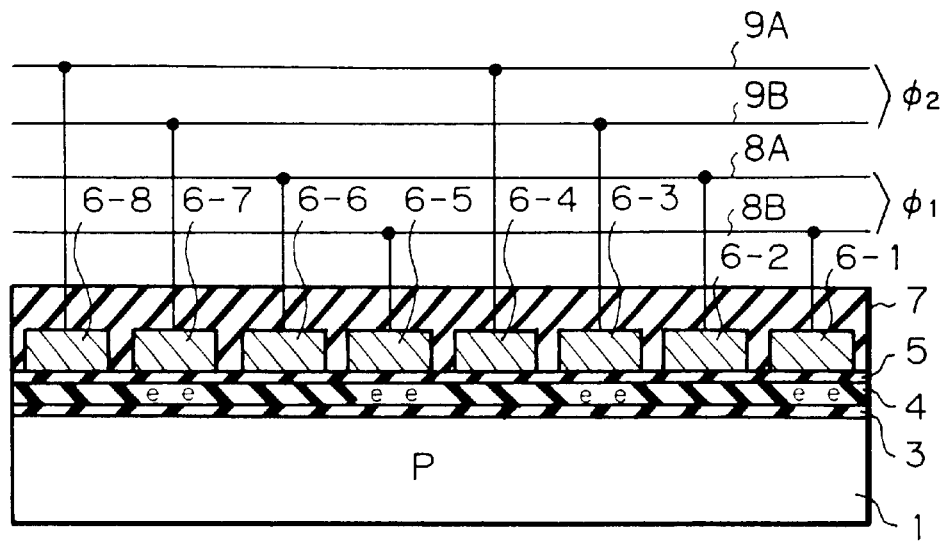
FIGS. 11A and 11B are cross-sectional views of modifications of the CCDs of FIGS. 5A and 8A, respectively.
Figure 11B:
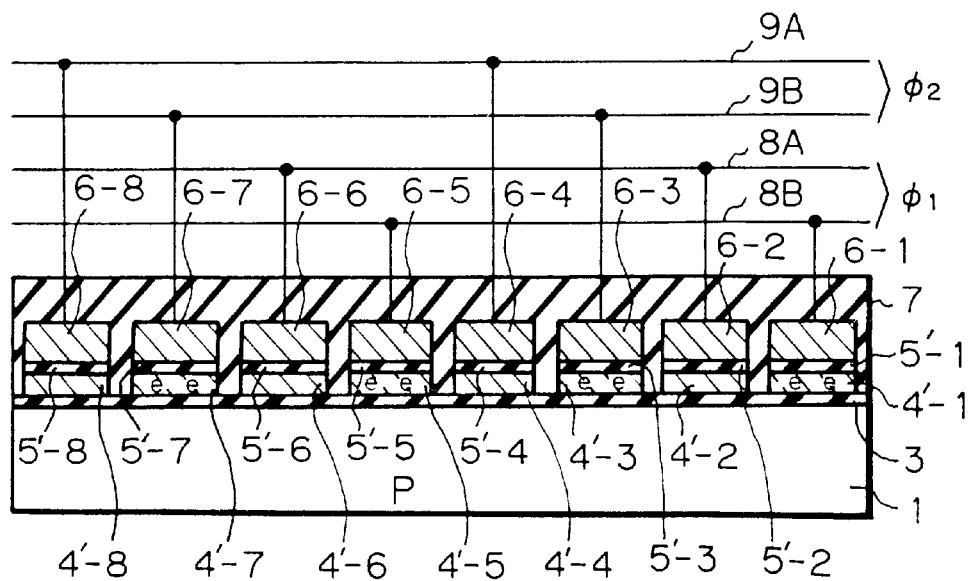

Further, the present invention can be applied to a surface channel type CCD where the conductivity type of the semiconductor substrate 1 is the same as that of the semiconductor layer 2, or the semiconductor layer 2 is omitted so that the silicon oxide layer 3 is formed directly on the semiconductor substrate 1 as illustrated in FIGS. 11A and 11B.

In addition, in FIGS. 6C, 7, 9C and 10, holes can be injected. In this case, the hole injected portions below the charge transfer electrodes serve as charge accumulation regions, not as potential barrier regions.

Further, in the above-mentioned embodiments, although charges are injected into a portion below one of every two charge transfer electrodes, charges can be injected into portions below every two transfer electrodes. In this case, the amount of injected charges in the portion below one of every two charge transfer electrodes is different from the amount of injected charges in the portion below the other of every two charge transfer electrodes, to obtain an asymmetrical electron well.

Still further, the CCD can be formed in a semiconductor well within a semiconductor substrate.

As explained hereinabove, according to the present invention, since the potential barrier regions (charge accumulation regions) are in self-alignment with the charge transfer electrodes, the potential protrusions or recesses at the edges of the charge transfer electrodes are dissolved to enhance the charge transfer efficiency.

What is claimed is:

1. A charge coupled device comprising:
    a semiconductor substrate of a first conductivity type;
    a first insulating layer formed on said semiconductor substrate;
    a plurality of pairs of floating electrodes formed on said first insulating layer;
    a plurality of pairs of second insulating layers each formed on one of said floating electrodes; and
    a plurality of pairs of charge transfer electrodes each formed on one of said second insulating layers,
    an amount of stationary charges trapped at one of each pair of said pairs of floating electrodes being different from an amount of stationary charges trapped at the other of each pair of said pairs of floating electrodes.

2. The device as set forth in claim 1, wherein said stationary charges are injected by charges moving from said semiconductor substrate to said charge transfer electrodes.

3. The device as set forth in claim 1, wherein said stationary charges are injected by charges moving from said charge transfer electrodes to said semiconductor substrate.

4. The device as set forth in claim 1, further comprising a semiconductor layer of a second conductivity type formed between said semiconductor substrate and said first insulating layer.

5. The device as set forth in claim 4, wherein said stationary charges are injected by charges moving from said semiconductor layer to said charge transfer electrodes.

6. The device as set forth in claim 4, wherein said stationary charges are injected by charges moving from said charge transfer electrodes to said semiconductor layer.

\* \* \* \* \*